United States Patent
Magnusen et al.

(10) Patent No.: US 9,171,457 B2
(45) Date of Patent: *Oct. 27, 2015

(54) SYSTEMS AND METHODS PROVIDING SIGNAL POWER DETECTION USING LOW PERFORMANCE CIRCUITRY

(71) Applicant: CSR Technology, Inc., San Jose, CA (US)

(72) Inventors: Tim Magnusen, Murphy, TX (US); Michael D. Womac, McKinney, TX (US)

(73) Assignee: CSR Technology, Inc., San Jose, CA (US)

(*) Notice: Subject to any disclaimer, the term of this patent is extended or adjusted under 35 U.S.C. 154(b) by 91 days.

This patent is subject to a terminal disclaimer.

(21) Appl. No.: 13/687,899

(22) Filed: Nov. 28, 2012

(65) Prior Publication Data

US 2013/0076495 A1    Mar. 28, 2013

Related U.S. Application Data

(63) Continuation of application No. 12/821,901, filed on Jun. 23, 2010, now Pat. No. 8,340,613.

(51) Int. Cl.
| | |
|---|---|
| *H04B 17/00* | (2015.01) |
| *G08C 19/02* | (2006.01) |
| *H03D 1/00* | (2006.01) |
| *H03D 3/00* | (2006.01) |
| *H04B 17/318* | (2015.01) |

(52) U.S. Cl.
CPC .................. *G08C 19/02* (2013.01); *H03D 1/00* (2013.01); *H03D 3/00* (2013.01); *H04B 17/318* (2015.01); *H03D 2200/005* (2013.01)

(58) Field of Classification Search
CPC ........................................................ H03D 1/00
USPC ............... 455/226.1, 226.2, 226.3, 179.1, 43, 455/67.11

See application file for complete search history.

(56) References Cited

U.S. PATENT DOCUMENTS

| | | | | |
|---|---|---|---|---|
| 5,563,537 | A * | 10/1996 | Seta ............................. | 327/113 |
| 2007/0121712 | A1 * | 5/2007 | Okamoto ..................... | 375/222 |
| 2009/0232251 | A1 * | 9/2009 | Huang ......................... | 375/295 |
| 2010/0061432 | A1 * | 3/2010 | Ben-Hamo et al. .......... | 375/222 |

* cited by examiner

*Primary Examiner* — Sanh Phu
(74) *Attorney, Agent, or Firm* — Mahamedi Paradice LLP

(57) ABSTRACT

Systems and methods which utilize low performance circuitry to provide received signal power detection without unacceptably impacting operation of a receiver circuit are shown. Circuitry utilized to provide received signal power detection according to embodiments comprises circuitry dedicated for use with respect to received signal power detection. Performance of the circuitry of the detection path may be lower than that required of circuitry of the signal processing path. However, performance parameters are selected to provide power detection of desired accuracy (e.g., flat gain) and to meet other performance metrics. Embodiments provide a low performance power detection circuit comprising a low performance tuner configuration. Further embodiments provide a low performance power detection circuit comprising a low performance data converter configuration.

21 Claims, 4 Drawing Sheets

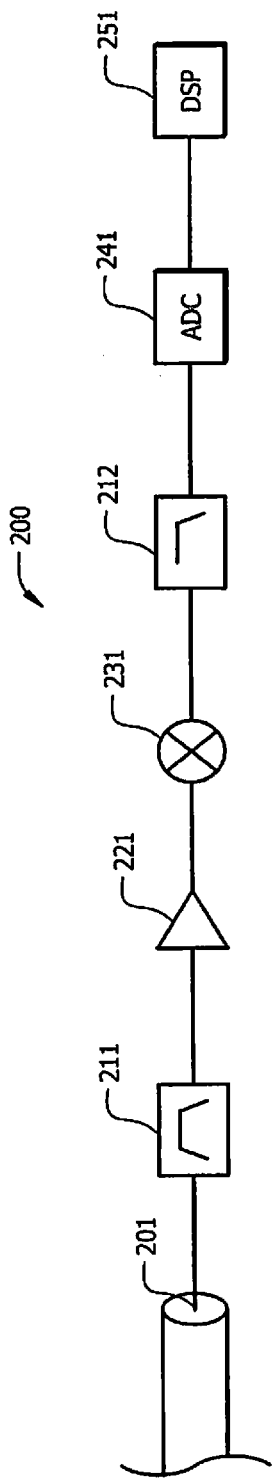
*FIG. 2*
*(Prior Art)*
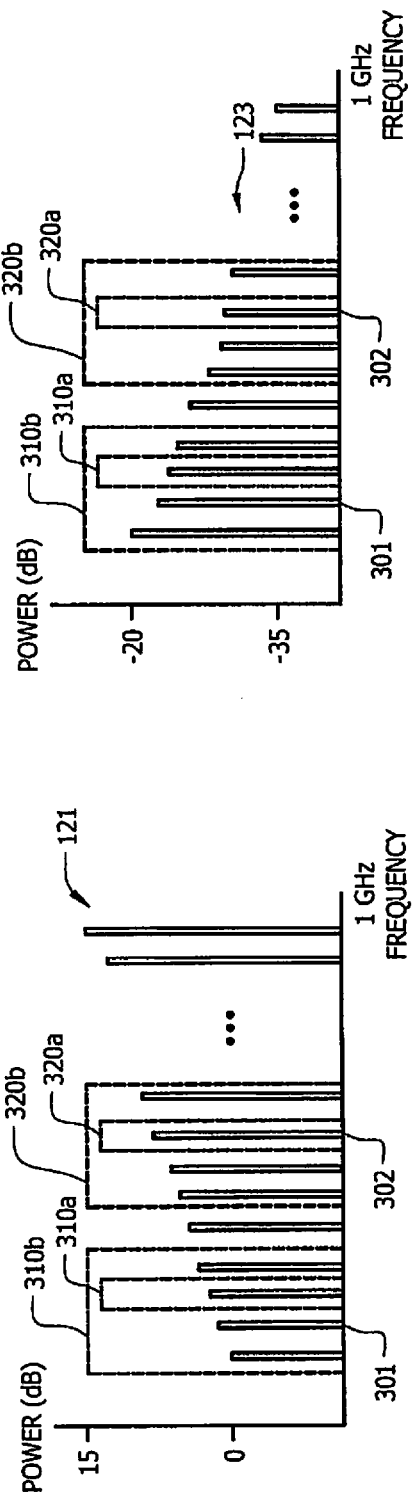
*FIG. 3A*
*FIG. 3B*

SYSTEMS AND METHODS PROVIDING SIGNAL POWER DETECTION USING LOW PERFORMANCE CIRCUITRY

CROSS-REFERENCE TO RELATED APPLICATIONS

This application is a continuation of U.S. patent application Ser. No. 12/821,901, filed Jun. 23, 2010 and entitled, "SYSTEMS AND METHODS PROVIDING SIGNAL POWER DETECTION USING LOW PERFORMANCE CIRCUITRY," the disclosure of which is incorporated by reference herein in its entirety.

TECHNICAL FIELD

The invention relates generally to receiver circuits operable to process desired signals from a plurality of transmitted signals and, more particularly, to providing signal power detection using low performance circuitry without impacting operation of the receiver circuit.

BACKGROUND OF THE INVENTION

Broadband transmission of signals has been in used for a number of years. For example, cable television systems utilize broadband transmission of signals to deliver various content (e.g., video, audio, and data) using a plurality of discrete channels. Many modern cable systems transmit a large number of discrete channels (e.g., 155 channels), each occupying a predetermined bandwidth (e.g., 6 MHz or 8 MHz channel bandwidth), using broadband spectrum (e.g., approximately 50 MHz-1 GHz). Accordingly, various content including broadcast content (e.g., television programs, movies, and audio programs), controlled delivery content (e.g., pay-per-view programs), on-demand content (e.g., individually requested/initiated program delivery), session content (e.g., individual data communication sessions), etc. may be provided through a cable system for selective use by subscribers and/or other receiver points.

Directing attention to FIG. 1, an exemplary cable system is illustrated as cable system 100. Cable system 100 includes cable transmission node 101 coupled to transmission media 102. Cable transmission node 101 may comprise a cable plant head-end, a repeater, or various other nodes utilized in transmission of cable system signals (e.g., 155 channels transmitted in the spectrum from approximately 50 MHz-1 GHz). Although referred to as a transmission node, it should be appreciated that cable systems may be bi-directional (e.g., providing some up-link capability such as for data sessions, interactive programming, etc.) and thus cable transmission node 101 may accommodate transmission and reception of signals. Transmission media 102 couples cable transmission node 101 to a plurality of receiver points, shown here as subscriber premises 111-113. Various devices, such as amplifier 103, may be provided in the cable system to facilitate desired signal communication.

Receiver circuitry may be utilized at the subscriber premises to select particular signals of the broadband transmission and to obtain content there from. Receiver circuit 200 of FIG. 2 shows a receiver circuit configuration which may be utilized at any or all of subscriber premises 111-113 to select a desired signal and obtain content carried by the selected signal. Circuit input 201, such as may be coupled to a tap or "drop" from transmission media 102, provides the signals of the broadband transmission to receiver circuit 200. Filter 211, such as may comprise a band-pass filter, provides signal filtering to substantially exclude signals outside of the spectrum of the broadband transmission (e.g., <50 MHz and/or >1 GHz). Amplifier 221, such as may comprise a low noise amplifier (LNA), provides signal amplification and/or buffering to compensate for noise and facilitate an acceptable noise figure with respect to receiver circuit 200. Mixer 231 provides frequency translation from a radio frequency (RF) used for converting a selected signal (or a contiguous block of signals) to a baseband frequency used in demodulating the selected signal. Filter 212, such as may comprise a low-pass filter, provides signal filtering to substantially exclude signals above the frequency translated selected signal (narrow-band demodulating receiver) or block of signals (wide-band demodulating receiver). Data converter 214, such as may comprise an analog to digital converter (ADC), converts the selected signal or block of signals to a digital representation for digital processing by digital signal processor (DSP) 251.

It should be appreciated that operation of cable system 100 introduces undesired attributes to the transmitted signals. For example, noise, signal distortion, and group delay may be introduced to signals transmitted by cable system 100. Transmission media 102 may provide a frequency response whereby different portions of the broadband transmission spectrum are affected differently by distortion. For example, coaxial cables typically utilized in cable transmission systems such as cable system 100 provide a frequency response in which higher frequencies are attenuated more so than lower frequencies. That is the transmission media rolls off at the high frequencies and thus higher frequencies experience greater attenuation as they propagate through the transmission media than do low frequencies. Broadband transmission in such a system experiences frequency response "tilt". Such frequency response tilt can be significant over a wide frequency range, such as the approximate gigahertz range common to cable transmission systems.

Various components of cable system 100 may be adapted to compensate for and/or mitigate the introduction of undesired attributes to the transmitted signals. For example, cable transmission node 101 and/or amplifier 103 may be adapted to provide offsetting tilt with respect to the broadband transmission in order to compensate for the aforementioned high frequency attenuation. As shown by graph 121 of FIG. 1, the amplitude of the broadband transmission signal may receive a positive amplitude tilt such that signals at the higher frequency end of the spectrum are transmitted at a greater amplitude. This positive amplitude tilt may be utilized to offset frequency response tilt, at least to some extent, associated with broadband transmission of signals. Nevertheless, transmission through media of sufficient length may overcome the positive amplitude tilt, resulting in a negative amplitude tilt of the broadband transmission signal, as shown by graph 123 of FIG. 1.

As illustrated by graphs 121 and 123 of FIG. 1, receiver circuits of subscriber premises disposed at different points in the cable system may experience appreciably different received signals. For example, receiver circuit 200 of subscriber premise 111, disposed nearest to cable transmission node 101, may experience received signals (graph 121) having not only relatively little attenuation from propagation through the cable transmission system, but also having the positive amplitude tilt provided to compensate for frequency response tilt of transmission media 102. In contrast, receiver circuit 200 of subscriber premise 113, disposed furthest from cable transmission node 101, may experience received signals (graph 123) having not only appreciable attenuation from propagation through the cable transmission system, but also having negative amplitude tilt resulting from the frequency response tilt of transmission media 102.

Accordingly, measurement of signal levels as received at various locations, such as subscriber premises, may be utilized by devices of cable system 100. For example, cable transmission node 101 may obtain power reports from subscriber premises devices for use in controlling aspects of the broadband transmission of signals to improve or optimize operation of cable system 100. Thus, DSP 251 may operate to provide power measurement processing with respect to a digital representation of a signal provided thereto for reporting to cable transmission node 101 and/or other devices of cable system 100.

In order to provide information regarding the power level of the channels of the broadband transmission of signals as received by receiver circuit 200 (i.e., the channel power level at circuit input 201), DSP 251 of typical prior art embodiments operates to correct the channel power level as measured by DSP 251 to account for the effects of components (e.g., filter 211, amplifier 221, mixer 231, filter 212, and data converter 214) of receiver circuit 200. For example, DSP 251 may operate to correct a channel power measurement to subtract a gain factor of a receiver circuit amplifier, add a signal loss amount associated with a receiver circuit filter, etc.

The specifications for many cable transmission systems impose relatively precise requirements upon the measurement of received signal power levels. For example, some DOCSIS specifications impose a ±3 dB measurement requirement for received signal power level reporting. Thus, manufacturers must generally provide extensive calibration with respect to receiver circuits, such as to measure the frequency response for many receiver circuit components over all or substantially all of the broadband spectrum, in order to facilitate accurate correction of the channel power level as measured by a receiver circuit. A lookup table, for example, may be generated through such calibration for use by DSP 251 in applying appropriate corrections to a power level measurement for a particular channel in order to provide a received signal power level report of sufficient accuracy. Such extensive calibration and its attendant lookup table present a significant cost, time, and resource utilization challenge with respect to providing acceptable received signal power level measurement in the prior art.

Additional challenges are posed in the heretofore prior art implementations. For example, DSP 251 of receiver circuit 200 is operable to provide signal demodulation of selected signals provided thereto for utilization of content by a user or termination device. Accordingly, where a power level measurement is needed for a signal of a channel other than that currently selected for demodulation (i.e., translated to baseband by mixer 231 and passed by filter 212), interruption of demodulation of a desired channel may be necessary in order to perform received signal power level measurement. This may be true even where multiple signals (e.g., a contiguous block of channels) are converted to baseband.

The need for interruption of desired channel demodulation is illustrated in FIG. 3A (illustrating the received channel profile at subscriber premise 111) and 3B (illustrating the received channel profile at subscriber premise 113), wherein channel 301 is a currently selected channel being demodulated by DSP 251 and channel 302 is a channel for which received signal power level measurement is desired. Where receiver circuit 200 provides for baseband processing of a single channel, as indicated by pass-bands 310a and 320a, demodulation of channel 301 must be interrupted in order to provide channel 302 to DSP 251 for power measurement processing. Similarly, even where receiver circuit 200 provides for baseband processing of multiple channels (e.g., a contiguous block of 4 channels), as indicated by pass-bands 310b and 320b, demodulation of channel 301 must be interrupted in order to provide channel 302 to DSP 251 for power measurement processing. However, interruption of channel demodulation may result in loss of data, interruption in service, and other undesirable and/or unacceptable consequences.

BRIEF SUMMARY OF THE INVENTION

The present invention is directed to systems and methods which utilize low performance circuitry to provide received signal power detection without unacceptably impacting operation of a receiver circuit. Circuitry utilized to provide received signal power detection according to embodiments comprises circuitry dedicated for use with respect to received signal power detection. Accordingly, embodiments provide a receiver circuit signal processing path (e.g., demodulating path) and a detection path (e.g., measurement path). Although performance (e.g., noise performance, frequency response, group delay, linearity, etc.) of the circuitry of the detection path may be lower than that required of circuitry of the signal processing path, performance parameters are selected to provide power detection of desired accuracy (e.g., flat gain response verse frequency) and to meet other performance metrics (e.g., low power, small circuit footprint, no or minimal calibration, etc.). That is, the circuitry of the detection path of embodiments have much lower signal to noise and distortion performance than circuitry of the corresponding signal processing path.

Embodiments of the present invention provide a low performance power detection circuit comprising a low performance tuner configuration operable to provide selection of one or more signals (e.g., channels) for power detection. The low performance tuner of embodiments provides flat gain response for accurate power detection with low power and minimum system overhead. Such a separate low performance tuner facilitates power detection operation in the background with respect to normal receiver circuit signal processing operation.

Further embodiments of the present invention provide a low performance power detection circuit comprising a low performance data converter configuration operable to provide conversion of received signals (e.g., channels) for power detection. The low performance data converter of embodiments is configured to provide relatively low data conversion resolution, which although is sufficient for power detection may be insufficient for signal content processing, for the broadband transmission spectrum. As with the low performance tuner configuration, such a separate data converter facilitates power detection operation in the background with respect to normal receiver circuit signal processing operation.

To facilitate operation of a low performance power detection circuit without adversely impacting operation of the corresponding signal processing path, embodiments of the invention utilize a high impedance matching network to couple the detection path to the signal processing path for received signal power detection. Although the use of such a high impedance circuit in a signal path is typically undesirable due to its associated increase in the noise power, embodiments are adapted to accommodate the increased noise level in the signal of the detection path, preferably without requiring calibration, and thus utilize such a matching network to minimize the impact of a parallel detection path upon the signal processing path.

Embodiments of a low performance power detection circuit provide a simple design that gives flexibility with respect to operation of a receiver circuit. In operation, the low performance power detection circuit can measure any channel while demodulation of a desired channel continues uninterrupted. This flexibility is provided without affecting the architecture choice with respect to the signal processing path and gives the benefit of very low, or even no, calibration overhead. The low performance power detection circuit of embodiments, although being much smaller than a signal processing circuit providing signal demodulation and being very low power, gives accurate received signal power detection results.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which:

FIG. 2 shows an exemplary prior art receiver circuit as may be utilized at the subscriber premises of the cable transmission system of FIG. 1;

FIGS. 3A and 3B show the received channel profile at different subscriber premises;

DETAILED DESCRIPTION OF THE INVENTION

Figure 1:
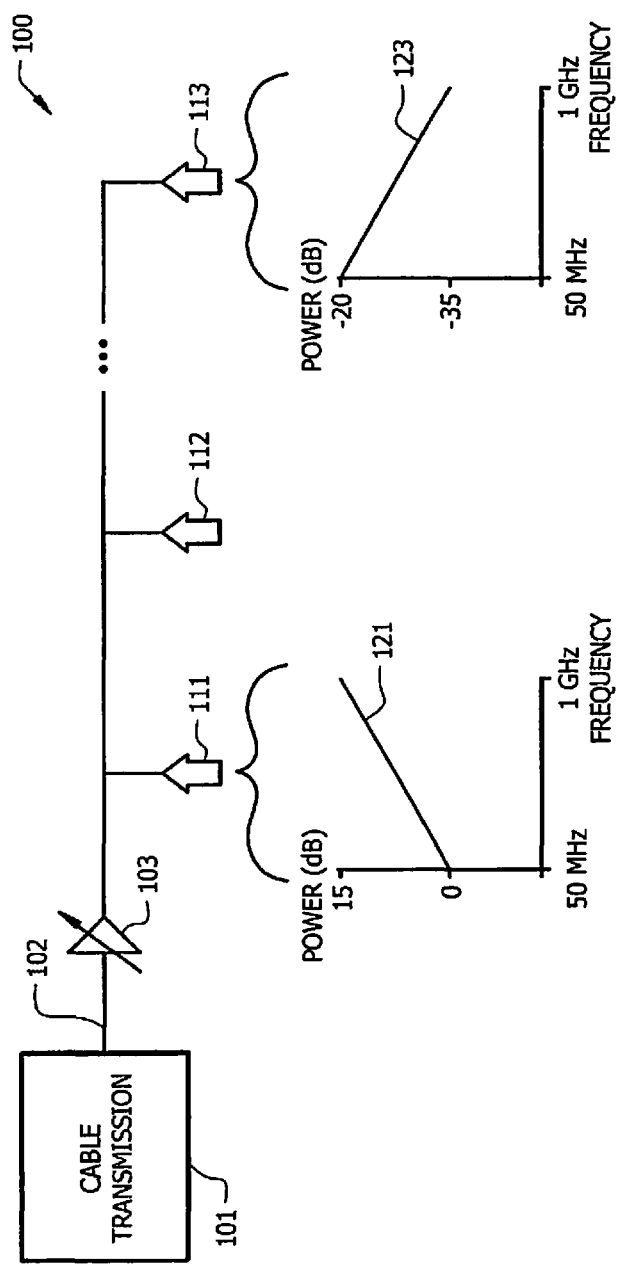
FIG. 1 shows a prior art cable transmission system.
Figure 4:
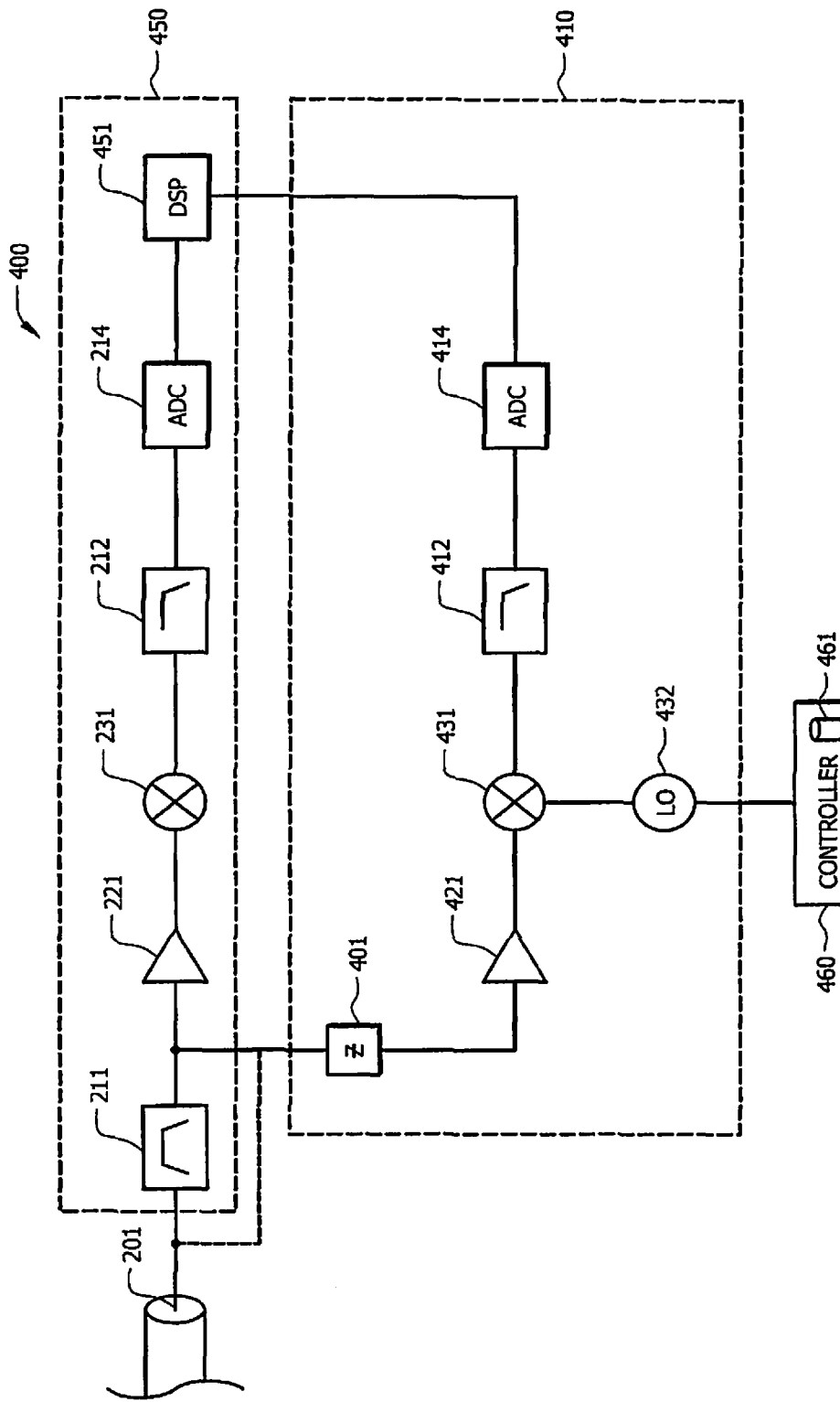
FIG. 4 shows a low performance power detection circuit of an embodiment of the invention.

FIG. 4 shows an embodiment of a receiver and power detection circuit of the present invention providing low performance circuitry to provide received signal power detection without unacceptably impacting operation of a receiver circuit. Receiver and power detection circuit 400 of the embodiment illustrated in FIG. 4 includes a receiver circuit signal processing path (shown as demodulating path 450) operable to provide desired receiver operation (e.g., signal selection, frequency translation, signal demodulation etc.). Additionally, receiver and power detection circuit 400 of the illustrated embodiment includes a detection path (shown as measurement path 410) operable to provide signal detection (e.g., signal selection, frequency translation, etc.). Receiver and power detection circuitry 400 of embodiments may be utilized at various locations (e.g., any or all of subscriber premises 111-113 of FIG. 1) to select particular signals of the broadband transmission and to obtain content there from using demodulating path 450 and to provide received signal power detection using measurement path 410. Such received signal power detection is provided using measurement path 410 of receiver and power detection circuit 400 without unacceptable impacting operation of demodulating path 450.

Demodulation path 450 of the illustrated embodiment includes filter 211, amplifier 221, mixer 231, filter 212, and data converter 214, operable as described above with respect to a typical receiver circuit. Demodulation path 450 of embodiments may be coupled to a tap or "drop" from a cable system transmission media (e.g., transmission media 102 of FIG. 1) via circuit input 201 to thereby receive signals of a broadband transmission. Data converter 214 converts a selected signal or block of signals to a digital representation for digital processing by DSP 451.

In providing conversion of signal data from analog to digital, data converter 214 of embodiments provides operation wherein an input signal amplitude window (e.g., an operating window having a minimum input signal level and a maximum input signal level) defines the input signal amplitudes which are accurately converted. Thus, in order to provide accurate demodulation of the signal using DSP 451 of embodiments, a signal or signals selected for demodulation should be provided at the input of data converter 214 having amplitudes within the operating window of data converter 214. Moreover, various other components of demodulation path 450 may have dynamic range limitations. For example, amplifier 221 may have an operating window wherein signals below the widow lower threshold are essentially lost in the noise and signals above the window upper threshold are clipped or otherwise distorted.

As discussed above, noise, signal distortion, and group delay may be introduced to signals transmitted by a cable system delivering signals to circuit input 201. In particular, coaxial cables typically utilized in cable transmission systems provide a frequency response in which higher frequencies are attenuated more so than lower frequencies. Thus, broadband transmission in such a system experiences frequency response tilt, as may be compensated for by application of a gain profile tilted oppositely. This, however, may result in signals as received at various locations having appreciably different amplitude profiles as discussed above with reference to FIGS. 1, 3A, and 3B. Signal power level reports with respect to one or more channels of a broadband transmission may be utilized by the cable system to manipulate signal amplitude levels, such as to fall within the operating windows of one or more components of receiver circuits.

Measurement path 410 of embodiments provides processing of signals for power level measurement and/or other signal detection operation, as may be requested by and/or reported to one or more system (e.g., a component of receiver and power detection system 400, a system of cable system 100, etc.). Accordingly, measurement path 401 of the illustrated embodiment includes amplifier 421, such as may comprise a LNA, providing signal amplification and/or buffering to provide a signal level suitable for further processing by measurement circuit 410. Mixer 431 provides frequency translation from a radio frequency (RF) used for converting a selected signal (or a contiguous block of signals) to a baseband frequency used in signal detection by receiver and power detection circuit 400. Filter 412, such as may comprise a low-pass filter, provides signal filtering to substantially exclude signals above the frequency translated selected signal (narrow-band demodulating receiver) or block of signals (wide-band demodulating receiver). Data converter 414, such as may comprise an analog to digital converter (ADC), converts the selected signal or block of signals to a digital representation for digital processing by DSP 451.

DSP 451 of receiver and power detection circuitry 400, in addition to being adapted to provide signal processing with respect to digital representations of selected signals as provided by data converter 214, is operable to accept signal information from measurement path 410 for measurement processing as described herein. For example, DSP 451 of embodiments may process a digital representation of a signal or signals provided thereto to provide a signal power level (e.g., instantaneous power level, average power level, root mean squared (RMS) power level, etc.). Alternatively, processing circuitry (not shown) other than DSP 451 (e.g., another DSP) may be provided to accept signal information from measurement path 410 for measurement processing as described herein, if desired. Information regarding signal power levels (e.g., as measured by DSP 451 or other processing circuitry) may be provided to one or more system (e.g., amplifier 221 of receiver and power detection system 400, cable transmission node 101 of cable system 100, amplifier 103 of cable system 100, etc.).

Measurement path 410 of receiver and power detection circuit 400 of embodiments is adapted to provide the foregoing received signal power detection without unacceptable impacting operation of demodulation path 450. Accordingly, the embodiment of measurement path 410 illustrated in FIG. 4 includes a high impedance matching network (shown as matching network 401) to couple measurement path 410 to circuit input 201, and thus demodulation path 450, for received signal power detection. That is, the illustrated embodiment utilizes matching network 401 to minimize the impact of measurement path 410 upon the operation of demodulation path 450 disposed in parallel therewith. Matching network 401 may comprise, for example, one or more resistor, capacitor, and/or inductor arranged in a circuit configuration (e.g., Pi, T, LL, etc. circuit configurations) adapted to provide a sufficiently high impedance to cause any distortion or signal loss, as experienced by demodulation path 450, associated with signals of the broadband transmission being tapped for use by measurement path 410 to be de minimis (i.e., of no substantive impact upon the operation of the demodulation path).

Figure 5:
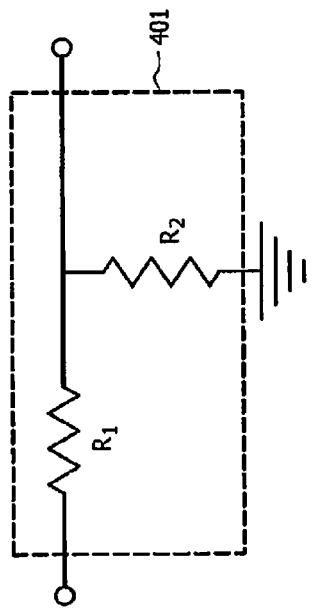
FIG. 5 shows detail with respect to a matching network according to an embodiment of the invention.

Directing attention to FIG. 5, detail with respect to an embodiment of matching network 401 as may be utilized according to embodiments is shown. Matching network 401 of FIG. 5 comprises a resistive divider, wherein resistances $R_1$ and $R_2$ are disposed in a resistive divider configuration. In providing a desired high impedance according to embodiments $R_1$ and $R_2$ are selected such that $R_1 \gg R_2$. Further, in providing a high impedance configured to minimize the impact of measurement path 410 upon the operation of demodulation path 450 according to embodiments, $R_1$ is selected such that $R_1 \gg Z_{dp}$. $Z_{dp}$ is the impedance of the demodulation path as seen at the point the measurement path taps the signal. For example, $Z_{dp}$ of the illustrated embodiment is essentially the impedance of amplifier 221 of demodulation path 450.

It should be appreciated that the use of a high impedance circuit in a signal path, such as measurement path 410, is typically undesirable due to the increased signal noise level associated with the high impedance circuit. However, embodiments of the present invention are adapted to accommodate the increased noise level in the signal used by measurement path 410 for measurement processing. Specifically, performance parameters (e.g., flat gain verses frequency response) of components of measurement path 410 are selected to provide power detection with desired accuracy and to meet other performance metrics (e.g., low power, small circuit footprint, no or minimal calibration, etc.). However, performance parameters more traditionally considered a measure of desirable signal processing operation (e.g., noise performance, frequency response, group delay, linearity, etc.) of components of measurement path 410 are lower than that required of components of demodulation path 450. For example, the noise figure and the linearity of the components of measurement path 410 may be degraded to a point that the design of these components (e.g., in an integrated circuit implementation) are simple and/or require less substrate space. Accordingly, components of measurement path 410 of embodiments have much lower signal to noise and distortion performance than components of demodulation path 450.

In operation according to embodiments of the invention, measurement path 410 provides selection of one or more signals (e.g., channels) for power detection. For example, signals of the broadband transmission are tapped from demodulation path 450 through matching network 401, which as discussed above preferably provides a high impedance matching network so as to minimize any impact upon signals of the broadband transmission as utilized by demodulation path 450. Amplifier 421 of embodiments provides signal amplification and/or buffering, using a known gain factor, to provide a signal level suitable for further processing by measurement circuit 410. Mixer 431 provides frequency translation under control of controller 460 according to embodiments. For example, controller 460 may receive information from one or more sources within cable system 100 (FIG. 1), such as cable transmission node 101, DSP 451, etc., regarding a channel or channels of the broadband transmission for power detection. Thus controller 460 may control local oscillator (LO) 432 appropriately for operation of mixer 431 to frequency translate the selected channel or channels from a radio frequency (RF) of the broadband transmission to a selected baseband frequency used by data converter 414. Filter 412 of embodiments provides low-pass filtering to substantially exclude signals above the baseband frequency or frequencies. Thus, a selected channel or channels is provided to data converter 414 for conversion to a digital representation for digital processing by DSP 451 according to embodiments. DSP 451 of embodiments operates to provide power measurement of the digital signal. The signal power measurement information may be provided to one or more systems within cable system 100 (FIG. 1), such as cable transmission node 101, amplifier 103, amplifier 221, etc., such as for controlling attributes of signals of the broadband transmission.

Embodiments of the invention utilizing a high impedance configuration of matching network 401 provide a signal of reduced power to measurement path 410. Because power is reduced, the performance is reduced. This is, by having matching network 401 as a high impedance, performance is reduced in measurement path 410. Thus, the components of measurement path 410 can be small by the virtue that accuracy both in performance and parametric stability is not needed. That is, in order to achieve good performance and parametric stability, the size of components generally must be increased when formed in an integrated circuit configuration.

As can be appreciated from the foregoing, embodiments of the present invention provide a low performance power detection circuit comprising a low performance tuner configuration operable to provide selection of one or more signals (e.g., channels) for power detection. The low performance tuner of measurement path 410 of embodiments provides flat gain response for accurate power detection with low power and minimum system overhead. Such a low performance tuner, separate from the higher performance tuner of demodulation path 450, facilitates power detection operation in the background with respect to normal receiver circuit signal processing operation. For example, when it is desired to make signal power measurements with respect to a channel or channels other than those currently being demodulated by demodulation path 450, measurement path 410 may operate to tune to the desired channel or channels for signal power measurement processing without disrupting signal demodulation (e.g., stopping demodulation of a desired channel during power measurement of a different channel) by demodulation path 450.

Moreover, receiver circuit signal processing paths of embodiments of the invention, such as demodulating path 450, provide for accurate power detection without requiring complex calibration. For example, because the components (e.g., matching network 401, amplifier 421, mixer 431, filter 412, and data converter 414) of measurement path 450 of embodiments are selected to provide a flat gain response across their operational bandwidth (perhaps at the expense of traditionally desirable performance parameters such as noise performance, frequency response, group delay, linearity, etc.), simple adjustment for aggregated gain factor (cumulative signal amplification and attenuation provided by the measurement path) may be applied to the signal power measurement. That is, a single gain factor correction may be applied to all signal power level measurements made using measurement path 410 of embodiments. Such an aggregated gain factor is readily determined, such as at time of manufacture, commissioning, during operation, etc., without the need for analysis of multiple frequencies or complicated calibration tables.

It should be appreciated that the embodiment illustrated in FIG. 4 disposes the tap providing the broadband transmission signal to measurement path 410 in the signal path after filter 211. That is, operation of filter 211 may affect the attributes of signals measured by measurement path 410. Such a filter, provided primarily for signal processing of demodulation path 450, is likely to be a relatively high performance filter resulting in non-flat gain verses frequency response. Accordingly, operation of measurement path 410 may be calibrated for operation with respect to such a component disposed in the signal path. However, because the frequency response of a filter such as filter 211 of embodiments is relatively stable and easily measured, embodiments provide for calibration (e.g., sweeping input frequencies and measuring gain) in a single step, such as during manufacture, commissioning, during operation, etc. A simple lookup table (e.g., one by many table, such as a single column (gain response), multiple row (frequency) table), such as may be stored in database 461, may be created and used to calibrate measurement path 410.

The foregoing frequency response calibration may be omitted according to embodiments of the invention. For example, an alternative embodiment of the invention may dispose the tap providing the broadband transmission signal to measurement path 410 in the signal path prior to filter 211, thus avoiding the effects of filter 211, as represented by the dotted line between circuit input 201 and matching network 401 of FIG. 4. For example, a cable operator may wish to use measurement path 410 to make measurements of frequencies outside of the bandwidth of filter 211. In an embodiment where the tap for measurement path 410 is prior to filter 211, only a single gain factor correction may be applied to all signal power level measurements made using measurement path 410, without the use of calibration information.

It should be appreciated that systems and methods which utilize low performance circuitry to provide received signal power detection without unacceptably impacting operation of a receiver circuit are not limited to use of a low performance tuner configuration. For example, alternative embodiments of the present invention provide a low performance power detection circuit comprising a low performance data converter configuration operable to provide conversion of received signals (e.g., channels) for power detection.

Figure 6:
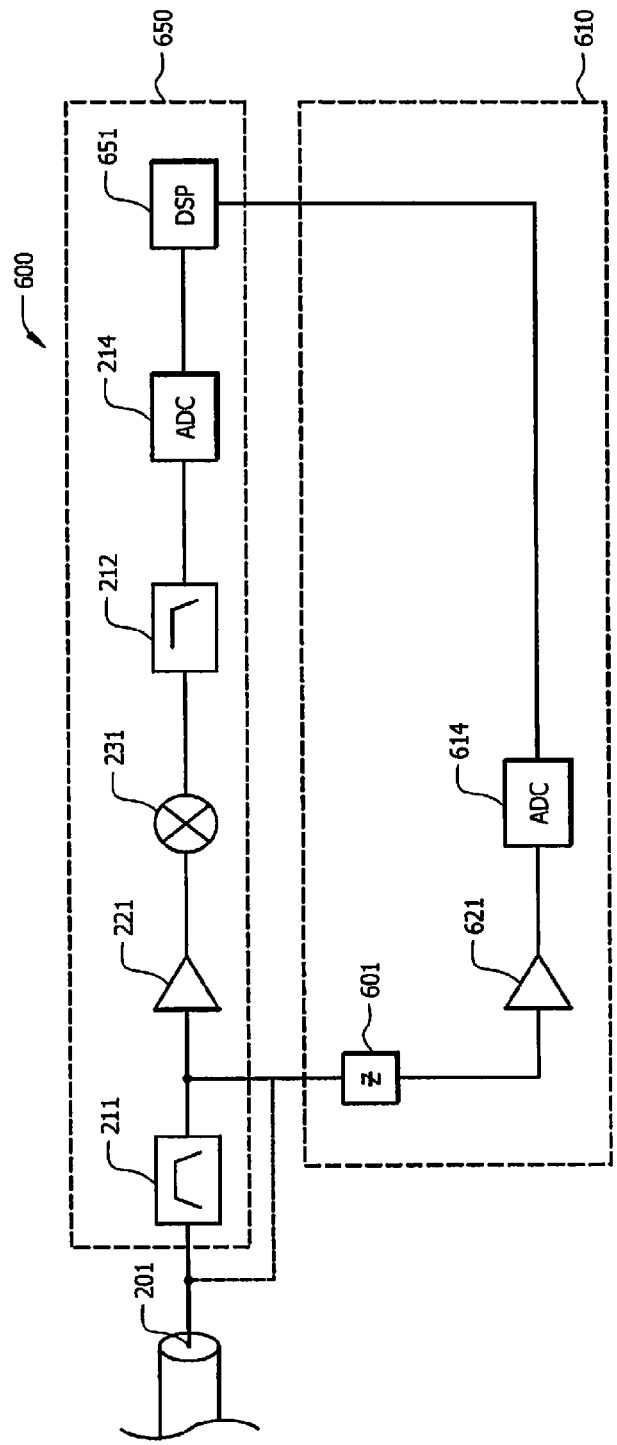
FIG. 6 shows a low performance power detection circuit of another embodiment of the invention.

The embodiment of FIG. 6 shows an embodiment of a receiver and power detection circuit of the present invention providing low performance data converter circuitry to provide received signal power detection without unacceptably impacting operation of a receiver circuit. Receiver and power detection circuit 600 of the embodiment illustrated in FIG. 6 includes a receiver circuit signal processing path (shown as demodulating path 650) operable to provide desired receiver operation. Additionally, receiver and power detection circuit 600 of the illustrated embodiment includes a detection path (shown as measurement path 610) operable to provide signal detection. Like receiver and power detection circuitry 400 above, receiver and power detection circuitry 600 of embodiments may be utilized at various locations (e.g., any or all of subscriber premises 111-113 of FIG. 1) to select particular signals of the broadband transmission and to obtain content there from using demodulating path 650 and to provide received signal power detection using measurement path 610. Such received signal power detection is provided using measurement path 610 of receiver and power detection circuit 600 without unacceptable impacting operation of demodulating path 650.

Demodulation path 650 of the illustrated embodiment includes filter 211, amplifier 221, mixer 231, filter 212, and data converter 214, operable as described above with respect to a typical receiver circuit. Demodulation path 650 of embodiments may be coupled to a tap or "drop" from a cable system transmission media (e.g., transmission media 102 of FIG. 1) via circuit input 201 to thereby receive signals of a broadband transmission. Data converter 214 converts a selected signal or block of signals to a digital representation for digital processing by DSP 651.

Measurement path 610 of embodiments provides processing of signals for power level measurement and/or other signal detection operation, as may be requested by and/or reported to one or more system (e.g., a component of receiver and power detection system 600, a system of cable system 100, etc.). Accordingly, measurement path 610 of the illustrated embodiment includes amplifier 621, such as may comprise a LNA, providing signal amplification and/or buffering to provide a signal level suitable for further processing by data converter 614. Data converter 614, such as may comprise an analog to digital converter (ADC), converts the signals to a digital representation for digital processing by DSP 651.

DSP 651 of receiver and power detection circuitry 600, in addition to being adapted to provide signal processing with respect to digital representations of selected signals as provided by data converter 214, is operable to accept signal information from measurement path 610 for measurement processing as described herein. For example, DSP 651 of embodiments may process a digital representation of a signal or signals provided thereto to provide a signal power level (e.g., instantaneous power level, average power level, root mean squared (RMS) power level, etc.). Alternatively, processing circuitry (not shown) other than DSP 651 (e.g., another DSP) may be provided to accept signal information from measurement path 610 for measurement processing as described herein, if desired. Information regarding signal power levels (e.g., as measured by DSP 651 or other processing circuitry) may be provided to one or more system (e.g., amplifier 221 of receiver and power detection system 600, cable transmission node 101 of cable system 100, amplifier 103 of cable system 100, etc.).

As with measurement path 410 above, measurement path 610 of receiver and power detection circuit 600 of embodiments is adapted to provide the foregoing received signal power detection without unacceptable impacting operation of demodulation path 650. Accordingly, the embodiment of measurement path 610 illustrated in FIG. 6 includes a high impedance matching network (shown as matching network 601) to couple measurement path 610 to circuit input 201, and thus demodulation path 650, for received signal power detection. Matching network 601 of embodiments is configured and operates as described above with respect to matching network 401.

As previously discussed, the use of a high impedance circuit in a signal path, such as measurement path 610, is typically undesirable due to the increased signal noise level associated with the high impedance circuit. However, embodiments of the present invention are adapted to accommodate the increased noise level in the signal used by measurement path 610 for measurement processing. Specifically, performance parameters (e.g., flat gain response) of components of measurement path 610 are selected to provide power detection with desired accuracy and to meet other performance metrics (e.g., low power, small circuit footprint, no or minimal calibration, etc.). However, performance parameters more traditionally considered a measure of desirable signal processing operation (e.g., noise performance, frequency response, group delay, linearity, etc.) of components of measurement path 610 are lower than that required of components of demodulation path 650. Accordingly, components of measurement path 610 of embodiments have much lower signal to noise and distortion performance than components of demodulation path 650. Moreover, the embodiment of measurement path 610 shown in FIG. 6 is adapted to utilize few components (e.g., omitting mixer and filter circuitry) to thereby minimize signal distortion in the measurement path.

In operation of measurement path 610 according to embodiments of the invention, signals of the broadband transmission are tapped from demodulation path 650 through matching network 601, which as discussed above preferably provides a high impedance matching network so as to minimize any impact upon signals of the broadband transmission as utilized by demodulation path 650. Amplifier 621 of embodiments provides signal amplification and/or buffering, using a known gain factor, to provide a signal level suitable for further processing by data converter 614. The entire spectrum of the broadband transmission (e.g., 50 MHz-1 GHz) is provided to data converter 614 of embodiments. Thus, data converter 614 preferably has enough dynamic range to receive the lowest amplitude signal and the highest amplitude signal of the broadband transmission. For example, embodiments of data converter 614 provide approximately 36-42 dB of dynamic range (or ENOB=6 or 7 bits; ENOBE=effective number of bits).

Data converter 614 of embodiments operates to sample the data at a sampling rate at least two times that of the highest frequency signal to be converted. For example, in the foregoing example where 1 GHz is the high end of the spectrum, data converter 614 would operate at a sampling rate of at least 2 GHz. Embodiments of the invention, however, utilize sampling rates greater than two times the highest frequency signal to be converted (e.g., a sampling rate of 3 GHz in the foregoing example where 1 GHz is the high end of the spectrum). Such higher sampling rates are utilized to avoid aliasing associated with the folding point of the sampling rate.

Data converter 614 of embodiments provides a data resolution of at least 60, such as to provide an even 10 bit data converter. Alternative embodiments of data converter 614 may provide data resolution other than 10 bits. For example, a measurement path data converter of embodiments may provide 6 or 7 bit data resolution, where such resolution is determined to provide desired signal power level accuracy.

The digital representation of the signals is provided by data converter 614 to DSP 651 for digital processing according to embodiments. DSP 651 of embodiments operates to provide power measurement of the digital signal. The signal power measurement information may be provided to one or more systems within cable system 100 (FIG. 1), such as cable transmission node 101, amplifier 103, amplifier 221, etc., such as for controlling attributes of signals of the broadband transmission.

It should be appreciated that data converter 614 of embodiments provides a low performance data converter configured to provide relatively low data conversion resolution, which although is sufficient for power detection may be insufficient for signal content processing, for the broadband transmission spectrum. As with the low performance tuner configuration of FIG. 4, such a separate data converter facilitates power detection operation in the background with respect to normal receiver circuit signal processing operation.

Embodiments of the invention utilizing a high impedance configuration of matching network 601 provide a signal of reduced power to measurement path 610. Because power is reduced, the performance is reduced. This is, by having matching network 601 as a high impedance, performance is reduced in measurement path 610. Thus, the components of measurement path 610 can be small by the virtue that accuracy both in performance and parametric stability is not needed. That is, in order to achieve good performance and parametric stability, the size of components generally must be increased when formed in an integrated circuit configuration.

As can be appreciated from the foregoing, low performance power detection circuits of embodiments of the invention provide a simple design that gives flexibility with respect to operation of a receiver circuit. In operation, the low performance power detection circuit can measure any channel while demodulation of a desired channel continues uninterrupted. This flexibility is provided without affecting the architecture choice with respect to the signal processing path and gives the benefit of very low, or even no, calibration overhead. The low performance power detection circuit of embodiments, although being much smaller than a signal processing circuit providing signal demodulation and being very low power, gives accurate received signal power detection results.

Moreover, low performance power detection circuits of embodiments provide for accurate signal power level measurement with little or no calibration. According to embodiments, the number of components in the signal path used by power detection circuits for which calibration may be desired is minimized to thereby allow for a simple, one step calibration process which results in easily implemented calibration information. In alternative embodiments of the invention, no components are disposed in the signal path of a receiver and power measurement circuit used by the power detection circuit, thereby avoiding a need for calibration.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A system comprising:
   a receiver circuit comprising:
   a demodulation path comprising tuner circuitry operable to provide tuning of at least one selected channel of a plurality of transmitted channels for demodulation of content carried by the at least one selected channel; wherein the tuner circuitry comprises a filter which is disposed outside of a signal path of a channel processed by the measurement path, wherein the filter has one or more performance parameters selected to facilitate the demodulation of content carried by the at least one selected channel; and
   a measurement path comprising low performance circuitry operable to provide received signal power detection without unacceptably impacting the demodulation of content carried by the at least one selected channel, wherein the low performance circuitry of the measurement path results in signal distortion which is not compatible with demodulation of content carried by a channel processed by the demodulation path.

2. The system of claim 1, wherein the tuner circuitry further comprises an amplifier which is disposed outside of the signal path of the channel processed by the measurement path, wherein the amplifier has one or more performance parameters selected to facilitate the demodulation of content carried by the at least one selected channel.

3. The system of claim 2, wherein the one or more performance parameters comprise a performance parameter selected from the group consisting of noise performance, frequency response, group delay, and linearity.

4. A system comprising:
   a receiver circuit comprising:
   a demodulation path comprising tuner circuitry operable to provide tuning of at least one selected channel of a plurality of transmitted channels for demodulation of content carried by the at least one selected channel; and
   a measurement path comprising low performance circuitry operable to provide received signal power detection without unacceptably impacting the demodulation of content carried by the at least one selected channel, wherein the low performance circuitry of the measurement path results in signal distortion which is not compatible with demodulation of content carried by a channel processed by the demodulation path;
   wherein the low performance circuitry comprises an amplifier which is disposed outside of a signal path of the at least one selected channel as processed by the demodulation path, wherein the amplifier has one or more performance parameters selected to facilitate the received signal power detection of a channel processed by the measurement path.

5. The system of claim 4, wherein the low performance circuitry comprises a filter which is disposed outside of the signal path of the at least one selected channel as processed by the demodulation path, wherein the filter has one or more performance parameters selected to facilitate the received signal power detection of a channel processed by the measurement path.

6. The system of claim 5, wherein the low performance circuitry comprises a mixer which is disposed outside of the signal path of the at least one selected channel as processed by the demodulation path.

7. The system of claim 4, wherein the low performance circuitry comprises a data converter which is disposed outside of the signal path of the at least one selected channel as processed by the demodulation path.

8. The system of claim 4, wherein the one or more performance parameters comprise a flat gain verses frequency response.

9. The system of claim 1, wherein the low performance circuitry comprises a matching network, wherein the matching network provides a sufficiently high impedance to cause distortion, as experienced by the demodulation path, associated with signals being tapped for use by the measurement path to be of no substantive impact upon demodulation of content by the receiver circuit.

10. A system comprising:
    a receiver circuit comprising:
    a demodulation path comprising tuner circuitry operable to provide tuning of at least one selected channel of a plurality of transmitted channels for demodulation of content carried by the at least one selected channel;
    a measurement path comprising low performance circuitry operable to provide received signal power detection without unacceptably impacting the demodulation of content carried by the at least one selected channel, wherein the low performance circuitry of the measurement path results in signal distortion which is not compatible with demodulation of content carried by a channel processed by the demodulation path; and
    a calibration table for use in performing received signal power detection by the measurement path, wherein the calibration table comprises a one by many table of gain response verses frequency.

11. A method comprising:
    providing a measurement path in parallel with a demodulation path, wherein the measurement path comprises circuitry having one or more first performance parameters selected to facilitate the received signal power detection of a channel processed by the measurement path, the circuitry further having one or more second performance parameters which are not compatible with demodulation of content carried by a channel processed by the demodulation path; and
    operating the measurement path to provide received signal power detection of a channel of a plurality of channels without interrupting demodulation of a channel of the plurality of channels by the demodulation path;
    wherein the one or more first performance parameters comprise a flat gain verses frequency response.

12. The method of claim 11, wherein the one or more second performance parameters comprise a performance parameter selected from the group consisting of noise performance, frequency response, group delay, and linearity.

13. A method comprising:
providing a measurement path in parallel with a demodulation path, wherein the measurement path comprises circuitry having one or more first performance parameters selected to facilitate the received signal power detection of a channel processed by the measurement path, the circuitry further having one or more second performance parameters which are not compatible with demodulation of content carried by a channel processed by the demodulation path; and
operating the measurement path to provide received signal power detection of a channel of a plurality of channels without interrupting demodulation of a channel of the plurality of channels by the demodulation path; and
coupling the measurement path to the demodulation path using a matching network, wherein the matching network provides a sufficiently high impedance to cause any distortion to be of no substantive impact upon demodulation of content by the receiver circuit.

14. The method of claim 11, further comprising:
controlling circuitry of the measurement path to tune a particular channel of a plurality of channels for received signal measurement, wherein tuning of the particular channel is independent of operation of circuitry of the demodulation path providing signal demodulation.

15. The method of claim 11, further comprising:
controlling circuitry of the measurement path to data convert channels of a plurality of channels for received signal measurement, wherein data conversion of the channels is independent of operation of circuitry of the demodulation path providing signal demodulation.

16. A radio frequency receiver circuit comprising:
a demodulation path having tuner circuitry operable to provide tuning of at least one selected channel of a plurality of transmitted channels for demodulation of content, wherein the demodulation path tuner circuitry is configured to provide one or more performance parameters selected to facilitate the demodulation of content carried by the at least one selected channel; and
a measurement path having circuitry operable to provide received signal power detection for one or more channel of the plurality of transmitted channels, wherein the measurement path circuitry is configured to provide a flat gain verses frequency response.

17. The radio frequency receiver circuit of claim 16, wherein the measurement path further has a matching network, wherein the matching network provides a sufficiently high impedance to cause any distortion, as experienced by demodulation path, associated with signals being tapped for use by the measurement path to be of no substantive impact upon demodulation of content by the receiver circuit.

18. The radio frequency receiver circuit of claim 16, wherein the measurement path circuitry comprises a mixer which is disposed outside of a signal path of the at least one selected channel as processed by the demodulation path.

19. The radio frequency receiver circuit of claim 16, wherein the measurement path circuitry comprises a data converter which is disposed outside of a signal path of the at least one selected channel as processed by the demodulation path.

20. The method of claim 13, further comprising:
controlling circuitry of the measurement path to tune a particular channel of a plurality of channels for received signal measurement independent of operation of circuitry of the demodulation path.

21. The method of claim 13, further comprising:
controlling circuitry of the measurement path to data convert channels of a plurality of channels for received signal measurement independent of operation of circuitry of the demodulation path.

* * * * *